(12) United States Patent
Nering

(10) Patent No.: US 6,309,163 B1
(45) Date of Patent: Oct. 30, 2001

(54) WAFER POSITIONING DEVICE WITH STORAGE CAPABILITY

(75) Inventor: Eric A. Nering, Modesto, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/960,906

(22) Filed: Oct. 30, 1997

(51) Int. Cl.$^7$ ..................................................... B65G 1/00
(52) U.S. Cl. ................... 414/331.01; 414/935; 414/936; 414/800; 414/816; 414/331.18
(58) Field of Search ................................. 414/754, 757, 414/779, 780, 331.01, 331.18, 935, 936, 800, 816

(56) References Cited

U.S. PATENT DOCUMENTS

| | | | |
|---|---|---|---|
| 4,775,281 | * 10/1988 | Prentakis | 414/936 X |
| 5,085,558 | * 2/1992 | Engelbrecht | 414/754 X |
| 5,162,047 | * 11/1992 | Wada et al. | 414/404 |
| 5,518,542 | * 5/1996 | Matsukawa et al. | 414/936 X |
| 5,566,466 | * 10/1996 | Hearne | 414/936 X |
| 5,842,824 | * 12/1998 | Nishi | 414/936 X |
| 5,842,825 | * 12/1998 | Brooks | 414/936 X |
| 5,848,670 | * 12/1998 | Salzman | 414/935 X |
| 5,851,102 | * 12/1998 | Okawa et al. | 414/936 X |
| 5,858,101 | * 1/1999 | Begin et al. | 414/936 X |
| 5,860,640 | * 1/1999 | Marohl et al. | 414/935 X |
| 5,879,128 | * 3/1999 | Tietz et al. | 414/935 X |
| 5,980,195 | * 11/1999 | Miyashita | 414/783 |

FOREIGN PATENT DOCUMENTS

| | | | |
|---|---|---|---|
| 2-142158 | * 5/1990 | (JP) | 414/754 |
| 3-34345 | * 2/1991 | (JP) | 414/936 |
| 63-86447 | * 4/1998 | (JP) | 414/936 |

* cited by examiner

*Primary Examiner*—Douglas Hess
(74) *Attorney, Agent, or Firm*—Dugan & Dugan LLP

(57) ABSTRACT

The present invention provides a wafer positioning device having wafer storage capability. The wafer positioning device has a wafer platform with wafer lift pins, a wafer position sensor, and a storage location in close proximity to the wafer platform and the wafer position sensor. The storage location may be above the wafer position sensor, in which case the wafer position sensor retracts or rotates so that the wafer lift pins may elevate a positioned wafer past the position sensor to the storage location. Alternatively, the storage location may be between the wafer platform and the wafer positioning device. The storage location is preferably formed by a plurality of rotatable towers or a plurality of retractable lift pins that are operatively coupled to the wafer platform and that have wafer support portions capable of assuming both a wafer storage position and a wafer passage position.

19 Claims, 10 Drawing Sheets

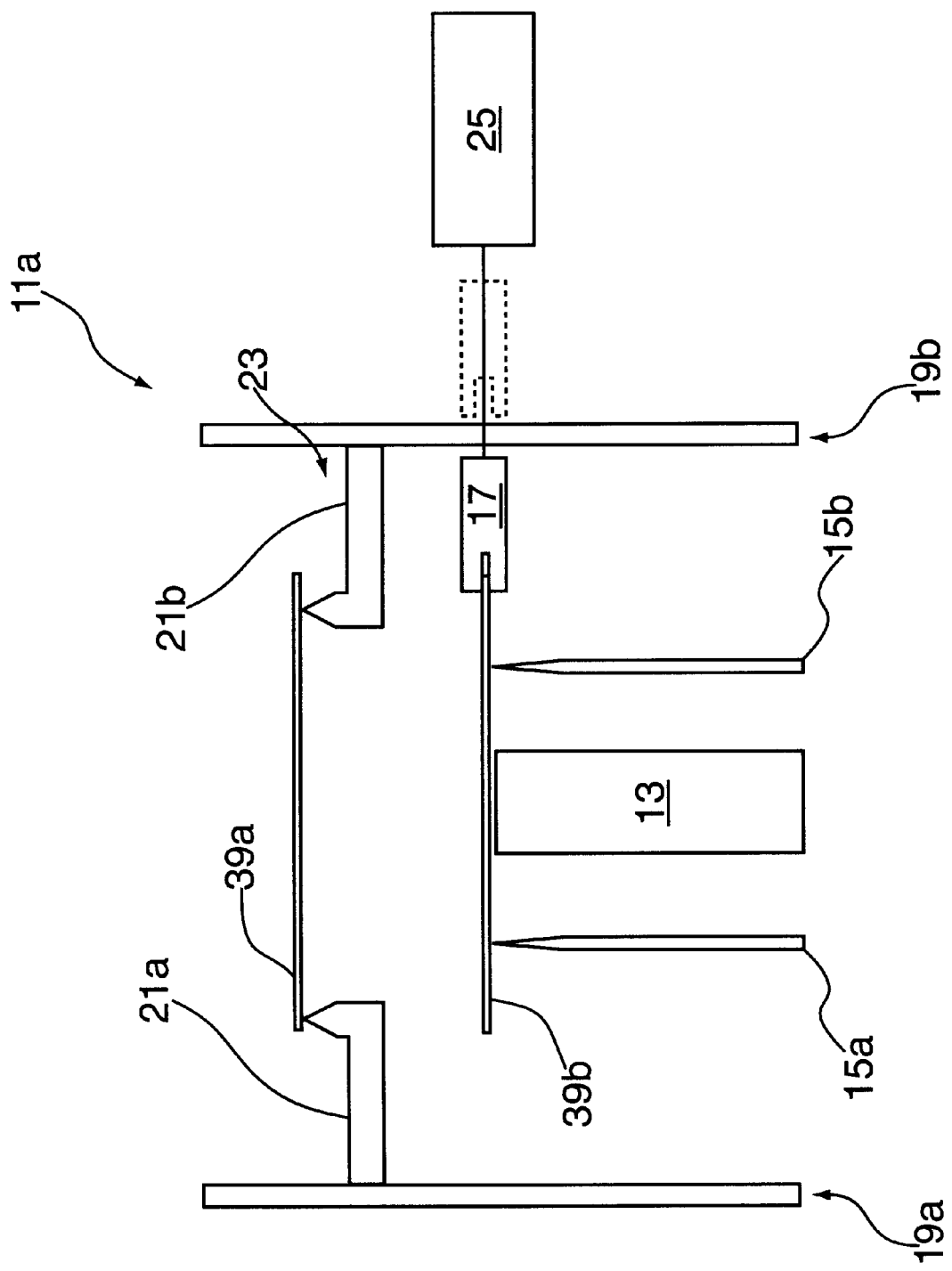

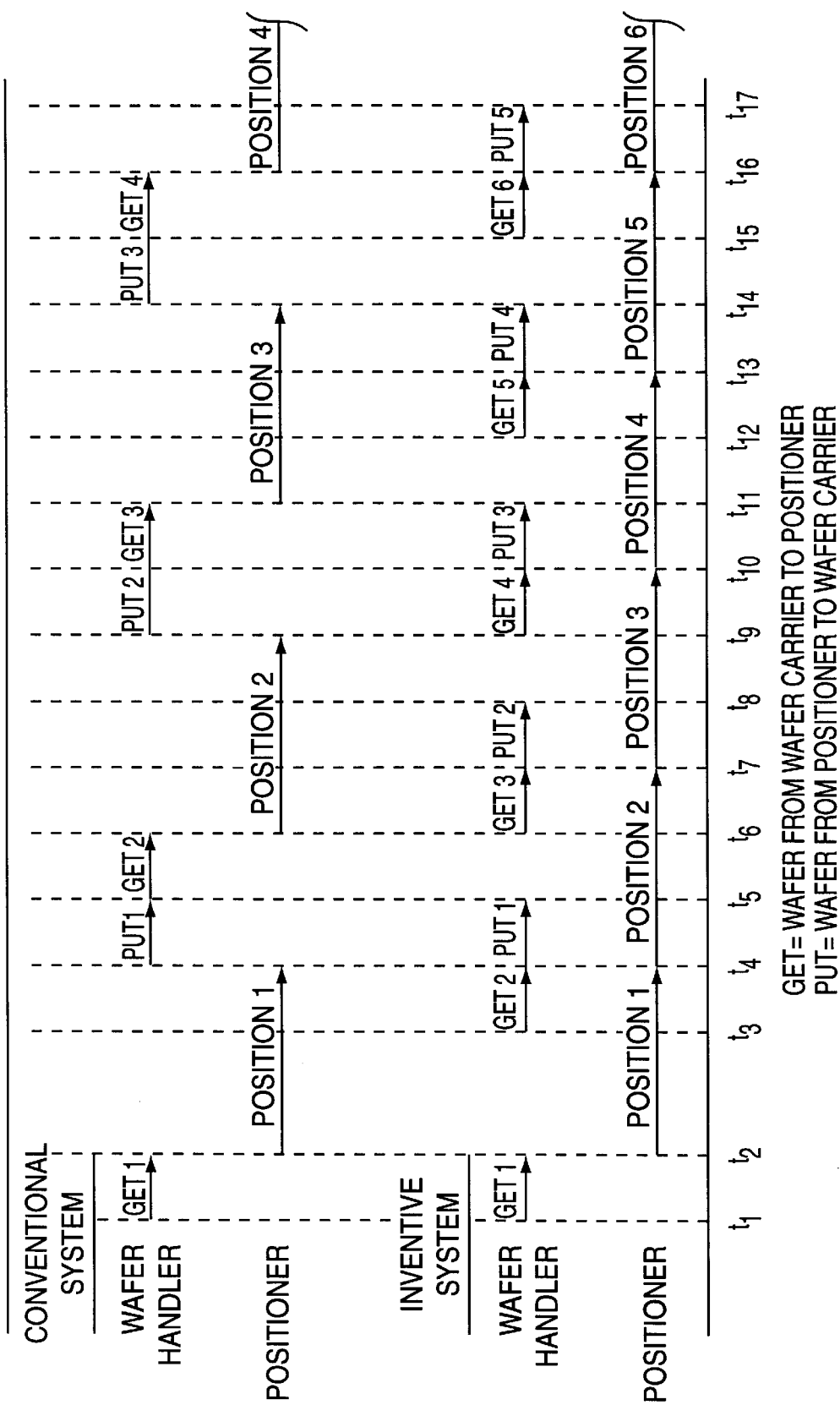

WAFER POSITIONING DEVICE WITH STORAGE CAPABILITY

BACKGROUND OF THE INVENTION

Proper centering of a semiconductor wafer is essential during wafer processing and transport in order to avoid costly errors such as nonuniform processing and/or wafer collision. During semiconductor device processing a wafer must be accurately centered on a wafer support platform in order to ensure the wafer will receive uniform processing across its entire face (e.g., uniformly deposited layers). Similarly, due to the rapid decrease in mechanical tolerencing associated with continually decreasing system footprint (i.e., the decrease of a fabrication system's lateral dimensions), a wafer must be accurately centered on the transfer mechanism in order to avoid collisions during semiconductor device transport, and in order to reduce the probability of the wafer sliding off or being dropped by the transfer mechanism. In addition some processes are sensitive to crystal orientation and require wafer alignment prior to being transferred to the processing chamber. Accordingly numerous wafer alignment and/or centering devices (i.e., positioning devices) exist.

Conventional centering devices typically comprise a rotatable platform having three or four wafer lift pins that lift a wafer off the platform and shift horizontally to center the wafer. A wafer position sensor positioned a small distance above the platform transmits information regarding the location of the wafer's center point to the wafer lift pins. In practice, because the wafer lift pins' horizontal movement is limited, the wafer lift pins may need to make multiple lift and shift operations to achieve the required movement of the wafer to achieve accurate centering. The wafer edge location is checked after each lift and shift operation to verify wafer centering was achieved, or to initiate additional wafer movement.

Like conventional centering devices, conventional wafer alignment devices typically comprise a platform having a rotatable surface and a wafer position sensor positioned a small distance above the platform. The wafer position sensor identifies when a flat/notched region of the wafer is in a predetermined position and transmits this information to the rotatable platform to cease rotation.

Because a wafer must be centered before it can be aligned, many conventional devices include both alignment and centering capabilities. However, whether for centering and/or alignment, wafer transfer to, wafer positioning at, and wafer transfer from conventional positioning devices (i.e., the wafer transfer and positioning operation) follows the same sequence: 1) a wafer handler extracts a first wafer from a multi-slot wafer carrier and transports the first wafer to the positioning device; 2) the positioning device positions the first wafer; and 3) the wafer handler returns the positioned first wafer to the multi-slot wafer carrier. Thereafter the sequence repeats and the wafer handler extracts a second wafer from the multi-slot wafer carrier and transports the second wafer to the positioning device, etc.

As indicated by the sequence described above, conventional wafer positioning devices allow only the wafer handler or the positioning device to operate at a given time (i.e., serial operation); the wafer handler remains idle while the positioning device operates, and the positioning device remains idle while the wafer handler operates. Such serial operation wastes equipment operating time, reducing throughput and increasing wafer costs. Accordingly a need exists for an improved wafer positioning device.

SUMMARY OF THE INVENTION

The present invention provides an improved wafer positioning device having a wafer storage location in addition to a wafer platform and a wafer position sensor. The wafer storage location enables simultaneous operation of the wafer handler and the positioning device (i.e., parallel operation), thereby allowing the inventive positioning device to achieve significant throughput increases.

In a first aspect one or more wafer storage locations exist above the wafer position sensor and the wafer position sensor is mounted so as to allow a wafer to travel therepast (e.g., rotatably or retractably mounted). In a second aspect additional or alternative wafer storage locations exist between the wafer platform and the wafer position sensor. A wafer presence sensor detects the presence of a wafer in the region between the wafer platform and the wafer position sensor and alters the operation of the wafer positioning device accordingly.

In a first embodiment the storage location is formed by three rotatable towers spaced evenly about the wafer platform at a position just beyond the circumference of the wafer to be positioned. Each tower has one or more wafer support portions positioned at desired elevations above the wafer platform. As the towers rotate the wafer support portions are selectively rotated inwardly for wafer storage or outwardly for wafer passage. Preferably towers comprising more than one wafer support portion are comprised of concentric tubes that allow independent rotation of each of the tower's wafer support portions. The wafer lift pins of the inventive positioning device can elevate a wafer to the elevation of each wafer support portion.

In operation, initially each wafer support portion is rotated outwardly (i.e., in the wafer passage position). The inventive positioner positions a first wafer, and the wafer lift pins elevate the positioned first wafer. Thereafter, the towers rotate to position the relevant wafer support portions under the wafer, creating a wafer storage location; while a wafer handler, operating in parallel with the inventive positioner, retrieves a second wafer from a wafer carrier, deposits the second wafer on the wafer platform and immediately picks up the first wafer from the storage location. The first wafer may then be returned to the wafer carrier or placed in a processing chamber. Thus the wafer storage location enables continuous parallel operation of the wafer handler and the wafer positioning device.

In a second embodiment of the invention the storage location is formed by wafer lift pins that elevate from the wafer platform to store a wafer above the platform. Like the rotatable towers of the first embodiment, the wafer lift pins of the second embodiment each have a wafer support portion capable of selectively assuming a wafer supporting position and a wafer passage position. In operation, initially each wafer support portion is rotated inwardly. The inventive positioner positions a first wafer, and the wafer lift pins elevate the positioned first wafer to a storage location. The wafer handler then removes the first wafer from the storage location formed by the wafer lift pins storage, the wafer support portions of the wafer lift pins assume the wafer passage position and the wafer lift pins lower into position beneath a second wafer positioned on the wafer platform.

The inventive wafer positioning device is twice as productive as conventional wafer positioning device as nearly a 100% productivity increase is realized prior to positioning of a third wafer. Other objects, features and advantages of the present invention will become more fully apparent from the following detailed description of the preferred embodiments, the appended claims and the accompanying drawings.

BRIEF DESCRIPTION OF THE DRAWINGS

FIGS. 1A, 1B and 1C are diagrammatic side elevational views of a first aspect of the inventive wafer positioning device having rotatable towers; the wafer support portions of which may selectively assume a wafer passage position as shown in FIGS. 1A and 1B, or a wafer storage position as shown in FIG. 1C;

FIG. 7 is a timing diagram useful in comparing the operation of the inventive wafer positioning device with the operation of a conventional wafer positioning device; and

DETAILED DESCRIPTION OF THE PREFERRED EMBODIMENTS

Figure 1A:
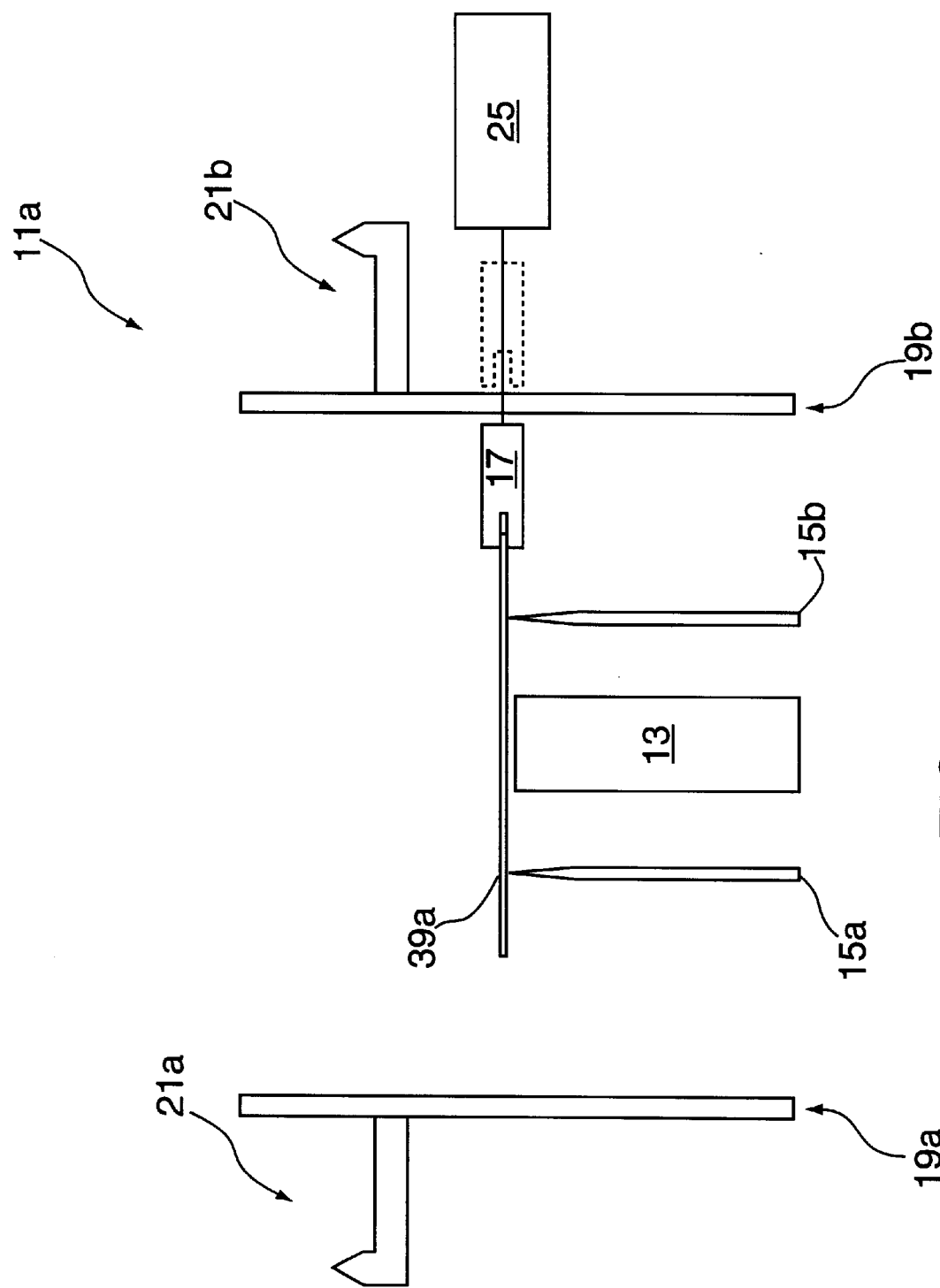
Figure 1B:
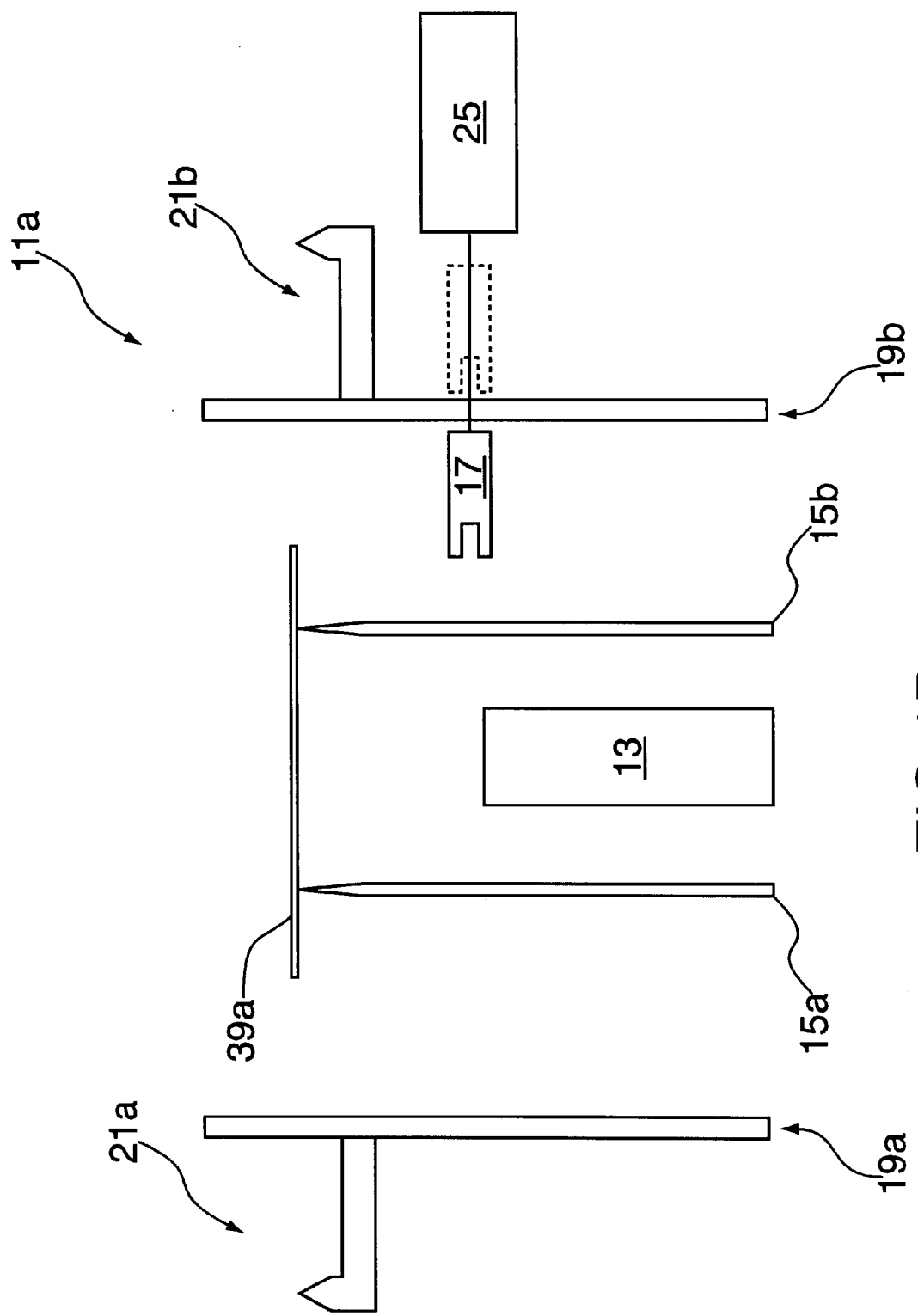

FIGS. 1A, 1B and 1C are side elevational views of an alignment and/or centering type wafer positioner 11a configured in accordance with a first aspect of the invention. The inventive wafer positioner 11a comprises a wafer platform 13 that preferably is rotatable so as to facilitate wafer alignment and/or centering, retractable wafer lift pins 15a, 15b operatively coupled to the wafer platform 13 (i.e., coupled so as to lift a wafer from the wafer platform), a wafer position sensor 17 operatively coupled to the wafer platform 13 (i.e., coupled so as to sense the position of a wafer on the wafer platform 13) and positioned a small distance thereabove, and a plurality of rotatable storage towers 19a, 19b.

Each of the storage towers 19a, 19b has a wafer support portion 21a, 21b coupled thereto at a first elevation such that a first wafer storage location 23 (FIG. 1C) is selectively formed when the wafer support portions 21a, 21b are rotated (via rotation of the storage towers 19a, 19b) to the wafer supporting position (FIG. 1C) and such that a wafer may travel therepast when the wafer support portions 21a, 21b are rotated (via rotation of the storage towers 19a, 19b) to the wafer passage position (FIGS. 1A and 1B).

The wafer position sensor 17 is rotatably or retractably mounted so as to perform wafer sensing when in a first position (i.e., the wafer sensing position) and to allow a wafer to travel therepast when in a second position (i.e., the wafer passage position—shown in phantom).

The wafer lift pins 15a, 15b may be shiftably coupled (e.g., to the wafer platform 13, to the chamber floor, etc.) in order to provide wafer centering capability, and can extend to the first elevation. The wafer position sensor 17 is operatively coupled to a controller 25, which in turn is operatively coupled to the wafer platform 13, the wafer lift pins 15a, 15b, and the storage towers 19a, 19b for control thereof.

Figure 2:
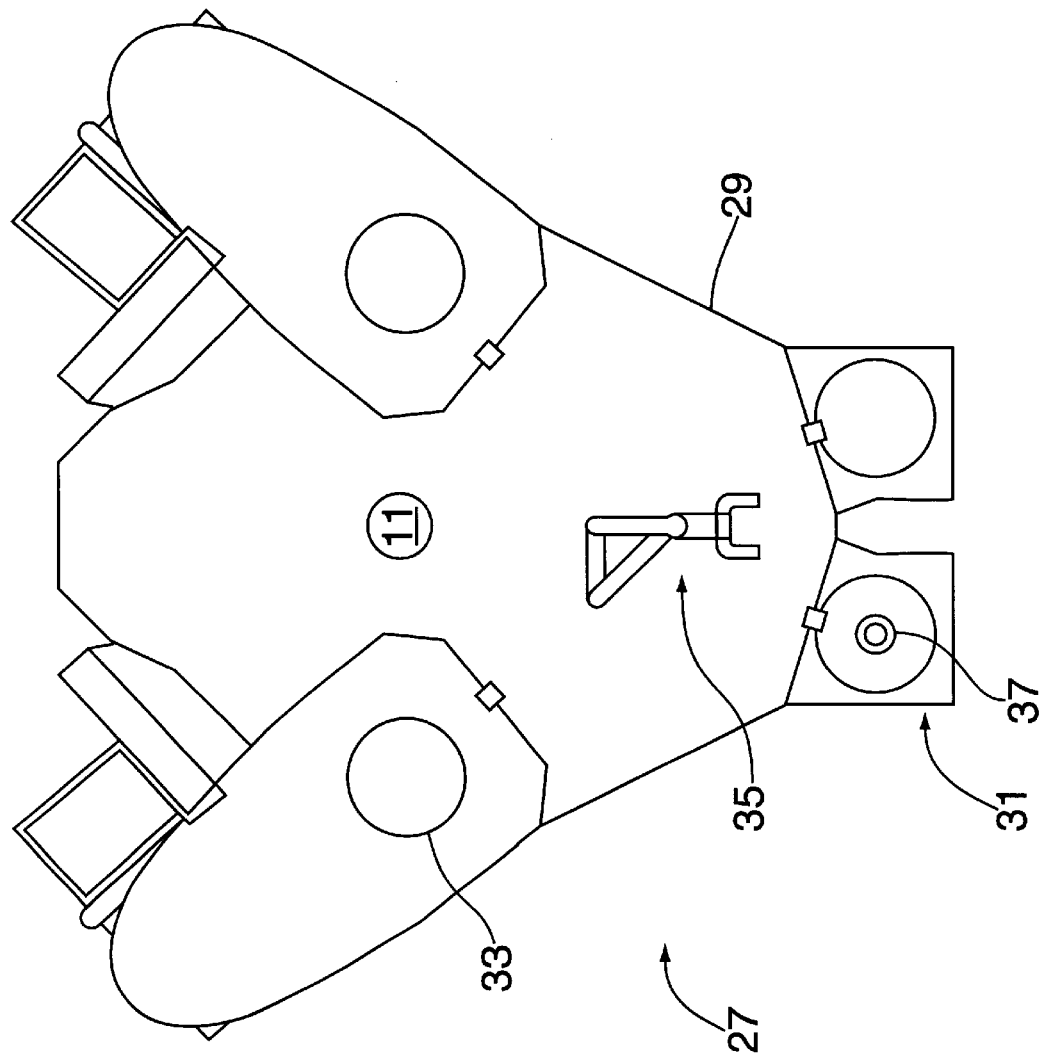
FIG. 2 is a top plan view of a fabrication system employing the inventive wafer positioning device.

The operation of the inventive wafer positioner 11a is described with reference to FIGS. 1A–C and 2. FIG. 2 shows a top plan view of a fabrication system 27 which contains the inventive wafer positioner referenced generally in FIG. 2 by the number "11". As shown in FIG. 2 the fabrication system 27 contains a transfer chamber 29 which couples a first load lock 31 and a first processing chamber 33. The transfer chamber 29 contains a wafer handler 35 and the inventive wafer positioner 11. A wafer carrier 37 is shown within the load lock 31.

Regarding the operation of the inventive wafer positioner 11a, initially the wafer lift pins 15a, 15b are in a retracted position at an elevation below the wafer supporting surface of the wafer platform 13, and the wafer support portions 21a, 21b and the wafer position sensor 17 (in phantom) are in the wafer passage position as shown in FIG. 1A. The wafer handler 35 extracts a first wafer 39a from the wafer carrier 37 and places it on the wafer platform 13.

Assuming the inventive wafer positioner 11 is a centering and alignment type positioner, the wafer position sensor 17 assumes the wafer sensing position and the wafer platform 13 rotates the first wafer 39a. The wafer position sensor 17 senses the center position of the first wafer 39a and outputs the position information to the controller 25. The controller 25 sends a control signal to the wafer platform 13 to cease rotation, and to the wafer lift pins 15a, 15b to perform a number of lift and shift operations in order to center the first wafer 39a. Thereafter the wafer platform 13 again rotates the first wafer 39a, and the wafer position sensor 17 senses the wafer's center position to ensure the first wafer 39a is accurately centered. Provided the first wafer 39a is accurately centered, wafer alignment is performed. That is, the wafer platform 13 again rotates while the wafer position sensor 17 senses for the flat or notched region of the first wafer 39a. Once the flat or notched region is sensed, the wafer position sensor 17 provides the wafer alignment information to the controller 25 which in turn signals the wafer platform 13 to cease rotation.

After the first wafer 39a is positioned (e.g., centered and aligned), the wafer position sensor 17 assumes the wafer passage position (shown in phantom) and the wafer lift pins 15a, 15b elevate the first wafer 39a to a position above the wafer supporting portions 21a, 21b (FIG. 1B). Thereafter the rotatable storage towers 19a, 19b rotate such that the wafer support portions 21a, 21b assume the wafer supporting position (forming the storage location 23 of FIG. 1C); and the wafer lift pins 15a, 15b retract to a position below the wafer supporting surface of the wafer platform 13 and a second wafer 39b is placed on the wafer platform 13 (as shown in FIG. 1C).

While the first wafer 39a is being centered, aligned and placed in the storage location 23, the wafer handler 35 travels back to the load lock 31, extracts the second wafer 39b from the wafer carrier 37, and, after the wafer lift pins 15a, 15b have sufficiently retracted, places the second wafer 39b on the wafer platform 13. Such parallel operation of the wafer handler 35 and the inventive wafer positioner 11 allows the wafer handler 35 to proceed to the storage location 23 to extract the first wafer 39a therefrom directly after depositing the second wafer 39b on the wafer platform 13 (i.e., the second wafer placement and the first wafer extraction occur consecutively).

Thereafter positioning of the second wafer 39b takes place directly after positioning of the first wafer 39a without waiting while the wafer handler operates (i.e., positioning of the first and second wafers occur consecutively). While the second wafer is being positioned the wafer support portions 21a, 21b assume the wafer passage position (FIG. 1A), and the process described above repeats until each wafer within the wafer carrier 37 has been processed.

Figure 3:
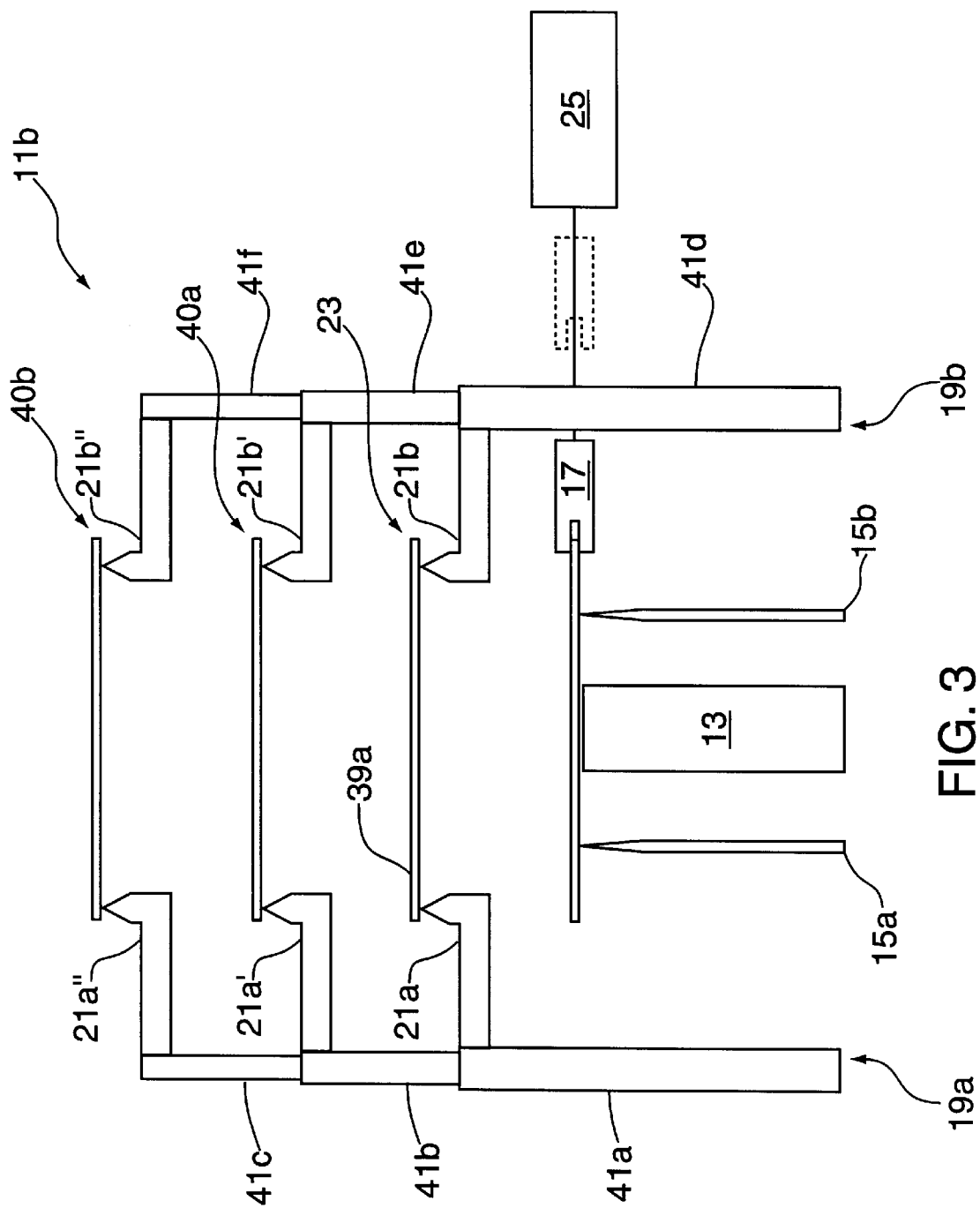
FIG. 3 is a diagrammatic side elevational view of a second aspect of the inventive wafer positioning device of FIG. 1, wherein each rotatable tower has a plurality of wafer support portions.

FIG. 3 is a diagrammatic side elevational view of a second aspect of the invention, showing an inventive wafer positioner 11b, having additional storage locations 40a, 40b. The additional storage locations 40a, 40b are formed by additional wafer support portions 21a', 21b' at a second elevation; and additional wafer support portions 21a'', 21b'' at a third elevation, respectively. Thus, the first storage tower 19a comprises the wafer support portion 21a and the two additional wafer support portions 21a' and 21a''; and the second storage tower 19b comprises the wafer support portion 21b and the two additional wafer support portions 21b' and 21b''. So that each wafer support portion may be rotated individually, the first storage tower 19a comprises a plurality of concentric tubes 41a–c, and the second storage tower 19b comprises a plurality of concentric tubes 41d–f. Preferably each concentric tube 41a–f has only one wafer support portion coupled thereto as shown in FIG. 3.

Aside from the additional storage locations 40a, 40b, and the inventive wafer positioner 11b of FIG. 3 is structurally identical to the inventive wafer positioner 11a of FIG. 1. Similarly the wafer positioner 11a and wafer positioner 11b operate identically, with the exception that the wafer lift pins 15a, 15b of FIG. 3 extend to each storage location 23, 40a, 40b (i.e., to the first, second and third elevations). When the wafer lift pins 15a, 15b transport a wafer to one of the additional storage locations 40a, 40b the wafer position sensor 17 assumes the wafer passage position as shown in phantom in FIG. 3.

The additional storage locations 40a, 40b provide greater flexibility, for example, enabling the inventive wafer positioner 11b to supply positioned wafers to more than one wafer handler. Thus the inventive wafer positioner 11b of FIG. 3 enables fabrication systems having a number of differing configurations to optimize their wafer handler/positioner usage.

Figure 4A:
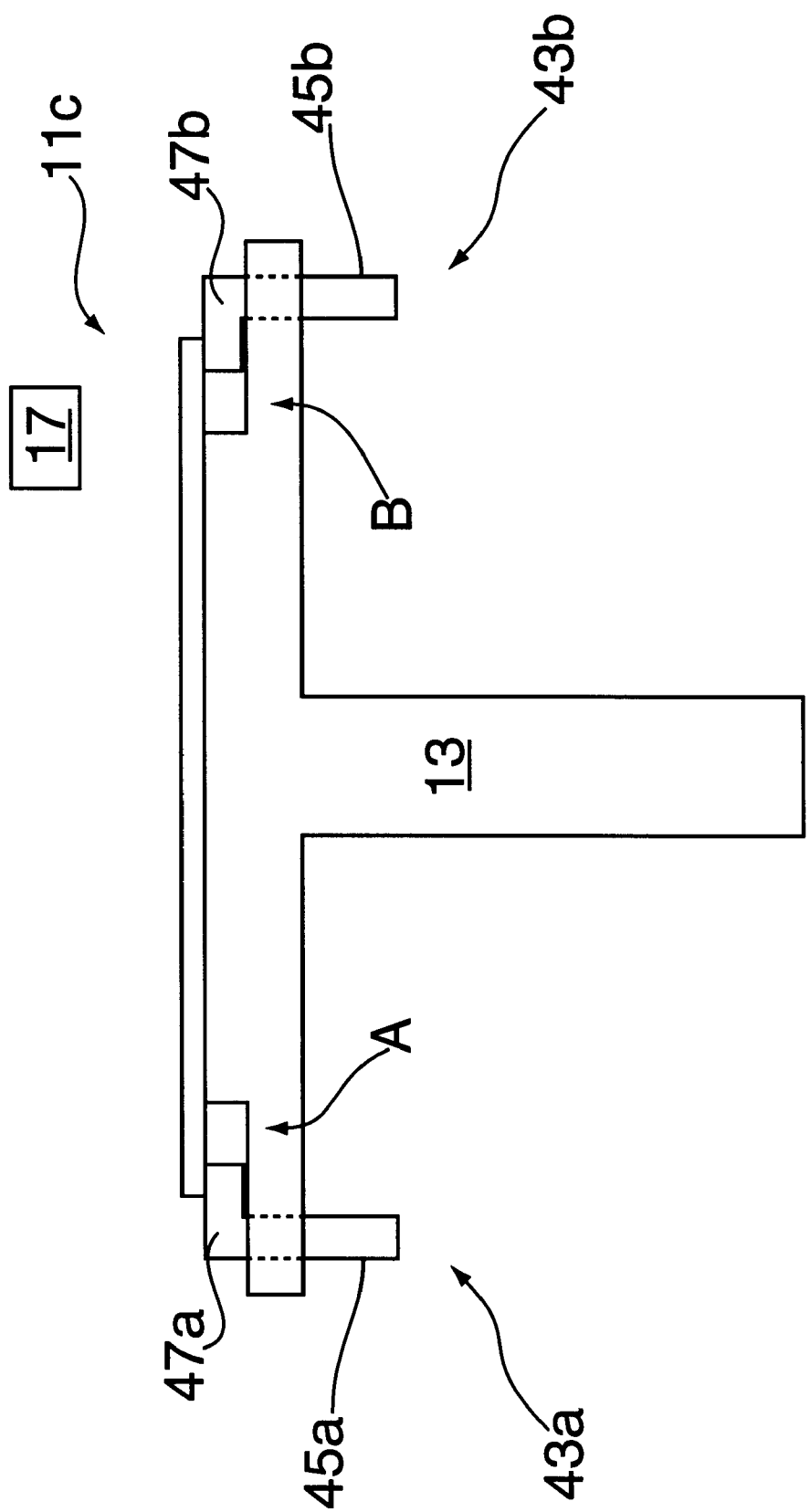
FIGS. 4A and 4B are diagrammatic side elevational views of a third aspect of the inventive wafer positioning device having storage pins that elevate from the platform to store a positioned wafer.
Figure 4B:
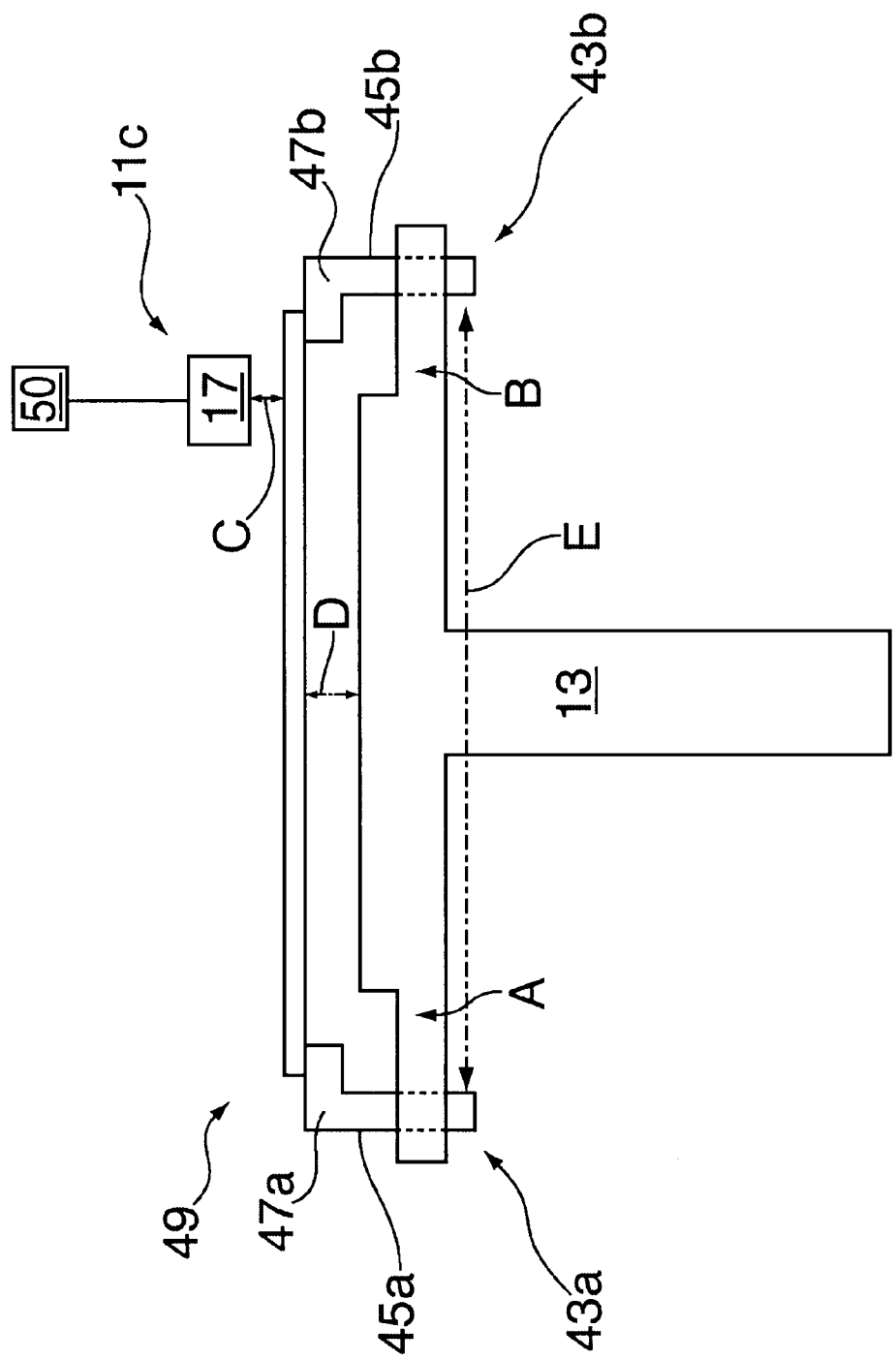

FIGS. 4A and 4B are side elevational views of an alignment type wafer positioner 11c configured in accordance with a third aspect of the invention. FIGS. 4A and 4B show a pair of storage pins 43a, 43b each having a translation portion 45a, 45b translatably mounted to the wafer platform 13 for traveling between a storage level and a platform level, and having wafer support portions 47a, 47b mounted to the translation portions 45a, 45b, respectively. In order to provide wafer centering the storage pins 43a, 43b may be shiftably coupled to the wafer platform 13, like the wafer lift pins 15a, 15b of FIGS. 1A–C and FIG. 3.

The wafer support portions 47a, 47b may be retractably mounted on the translation portions 45a, 45b so as to provide a wafer supporting position when the wafer support portions 47a, 47b are extended (FIG. 4A), and a wafer passage position when the wafer support portions 47a, 47b are retracted (not shown). Alternatively the wafer support portions 47a, 47b of FIGS. 4A and 4B may be stationarily mounted to rotatable translation portions 45a, 45b (much like the storage towers 19a, 19b and the wafer support portions 21a, 21b of FIGS. 1A–C and 3) so as to provide a wafer supporting position when the wafer support portions 47a 47b are rotated toward each other (FIG. 2A), and a wafer passage position when the wafer support portions 47a, 47b are rotated away from each other (not shown).

The wafer support portions 47a, 47b each have a sufficient surface area so that together they may provide stable wafer support. When the wafer supporting portions 47a, 47b are stationarily mounted to the translation portions 45a, 45b the platform 13 is configured with a first recess and a second recess (represented in FIG. 4B as "A" and "B") in the wafer platform 13 adjacent the first and second translation portions 45a, 45b, respectively. The first and second recesses allow the wafer support portions 47a, 47b to rotate between the wafer supporting position and the wafer passage position while the translation portions 45a, 45b are in the platform level position.

When the translation portions 45a, 45b assume the storage level position and the wafer support portions 47a, 47b assume the wafer supporting position a wafer storage location 49 is formed (FIG. 4B). When the wafer storage location 49 is formed intermediate the wafer platform 13 and the wafer position sensor 17, a sufficient distance (referenced in FIG. 4B by the letter "C") exits between the storage location 49 and the wafer position sensor 17 to allow wafer transfer to and from the 5storage location 49; a sufficient distance (referenced in FIG. 4B by the letter "D") exists between the wafer platform 13 and the storage location 49 to allow wafer transfer to and from the wafer platform 13; and a sufficient distance (referenced in FIG. 4B by the letter "E") exists between the translation portions 45a, 45b to allow a wafer (which may be off-center in any direction) to pass therebetween.

The wafer position sensor 17 may include a wafer presence sensor for detecting the presence of a wafer in storage location 49 or, alternatively a separate wafer presence sensor may be employed. The presence of a wafer in storage location 49 precludes the wafer position sensor 17 from determining if a wafer on the wafer platform 13 is centered. Accordingly, if a wafer is present in the storage location 49, preferably a controller 50 coupled to both the wafer position sensor 17 and to the wafer presence sensor delays wafer position sensing until the wafer has been removed from the storage location 49.

It should be noted that conventional wafer lift pins employed for centering a wafer do not require the wafer support portions 47a, 47b because conventional wafer lift pins are positioned closely enough such that the translation portions 45a, 45b lift the wafer. That is, conventional lifting and/or centering pins do not need to be spaced a sufficient distance "E" to enable a wafer to be transferred therebetween. Accordingly, conventionally the translation portions 45a, 45b lift the wafer and a separate wafer support portion 47a, 47b is not needed.

In operation, initially the translation portions 45a, 45b are in the platform level position and the wafer support portions 47a, 47b are in the wafer supporting position (FIG. 4B). The wafer handler 35 (FIG. 2) extracts a first wafer (not shown) from the multi-slot wafer carrier 37 and transports the first wafer to the wafer platform 13 of the inventive wafer positioner 11c. The wafer platform 13 rotates while the wafer position sensor 17 determines whether the first wafer is centered. Thereafter, the storage pins 43a, 43b lift and shift the first wafer a number of times (followed by wafer rotation to determine wafer position) until the wafer position sensor 17 determines the first wafer is centered. Thereafter, to align the first wafer, the wafer platform 13 rotates until the wafer position sensor 17 detects a flat/notched region of the first wafer (indicating proper wafer alignment) and then signals the wafer support 13 to cease rotation.

After the first wafer is properly centered and aligned the translation portions 45a, 45b elevate lifting the first wafer from the wafer platform 13 to the storage location 49 (FIG.

4B) intermediate the wafer platform 13 and the wafer position sensor 17.

The inventive positioner 11c and the wafer handler 35 operate in parallel. While the positioning device 11c is positioning the first wafer the wafer handler 35 (FIG. 2) extracts a second wafer from the multi-slot wafer carrier 37 (FIG. 2) and while the wafer translation portions 45a, 45b elevate the first wafer to the storage position 49, the wafer handler 35 transports the second wafer to the wafer platform 13.

Because the distance "E" between the translation portions 45a, 45b of the storage pins 43a, 43b is sufficient to allow a wafer (which may be off center in any direction) to pass therebetween, the second wafer may be deposited on the wafer platform 13 despite the presence of the extended storage pins 43a, 43b. After the wafer handler 35 deposits the second wafer, it proceeds directly to the storage location 49 to extract the first wafer therefrom (i.e., the second wafer placement and the first wafer extraction occur consecutively).

Thereafter alignment of the second wafer takes place directly after alignment of the first wafer without waiting while the wafer handler 35 operates (i.e., alignment of the first and second wafer occur consecutively). To allow the second wafer to be positioned the wafer support portions 47a, 47b assume the wafer passage position (either by retraction or rotation as previously described) and the translation portions 45a, 45b lower to the platform level position (FIG. 4A). Once the translation portions 45a, 45b are in the platform level position (just beneath the second wafer) the wafer support portions 47a, 47b again assume the wafer supporting position; the spaces A and B in the wafer platform enable the wafer support portions 47a, 47b to rotate or extend from the wafer passage position to the wafer supporting position. The storage pins 43a, 43b are thus ready to elevate and store the second wafer as soon as alignment of the second wafer is complete. Although less preferred, the operating sequence can be reversed such that the wafer handler 35 deposits an incoming wafer in the storage location 49 and extracts a positioned wafer from the wafer platform 13.

Figure 5:
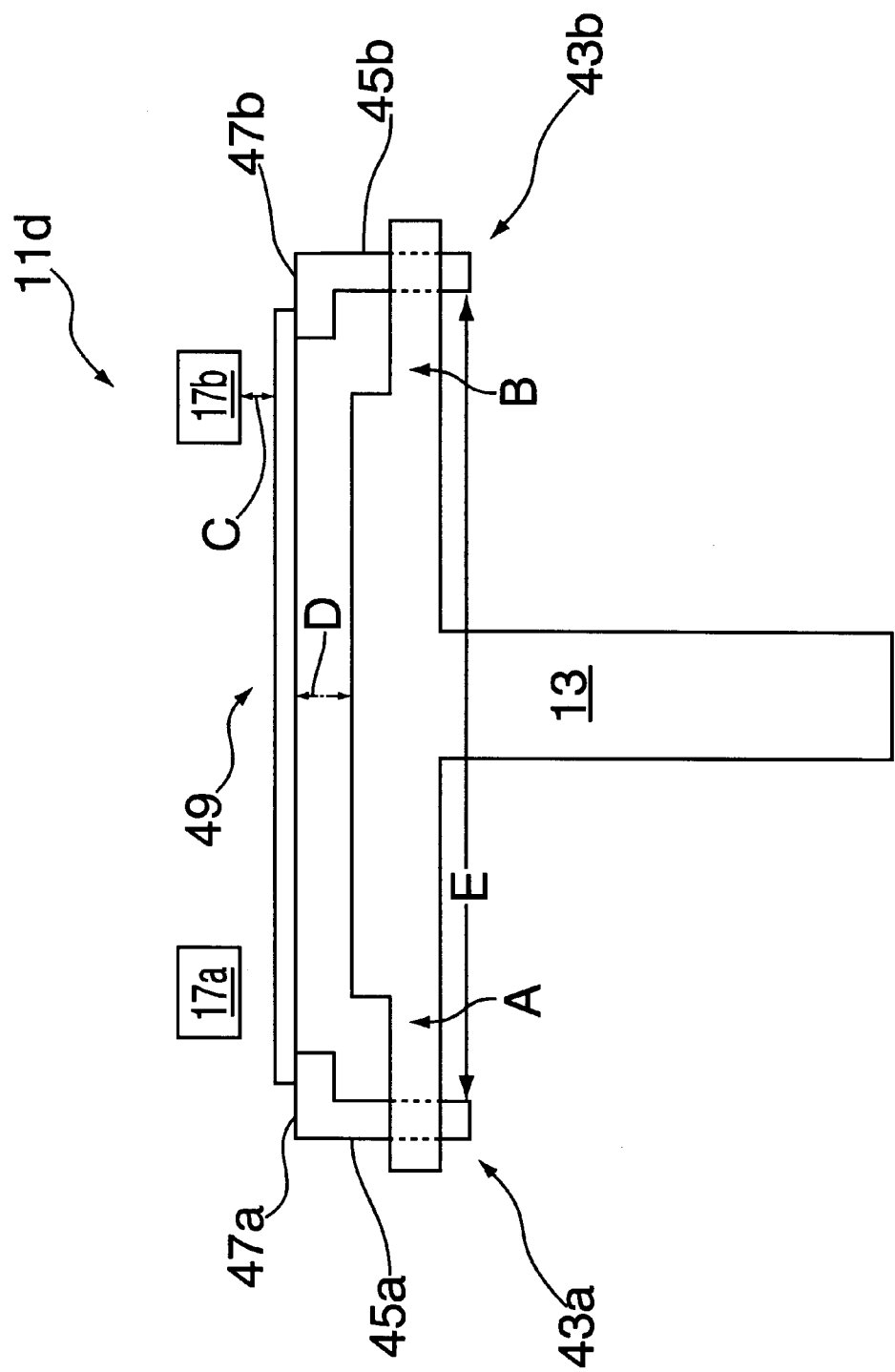
FIG. 5 is a diagrammatic side elevational view of a fourth aspect of the inventive wafer positioning device having storage pins that elevate from the platform to center a wafer.

FIG. 5 is a side elevational view of a centering type wafer positioner 11d configured in accordance with a fourth aspect of the invention. In this aspect the wafer platform 13 acts as a buffer location for receiving incoming wafer's to be positioned while the storage pins 43a, 43b center the wafer. The inventive wafer positioner 11d of FIG. 5 is identical to that of FIG. 4 except the wafer platform 13 need not rotate. In this embodiment two wafer position sensors 17a, 17b are preferably employed in order to accurately determine the position of the wafer, without rotating the wafer.

The operation of the centering type wafer positioner 11d of FIG. 5 is similar to that of FIGS. 4A and 4B. Initially the translation portions 45a, 45b are in the platform level position and the wafer supporting portions 47a, 47b are in the wafer supporting position. A first wafer is placed on the wafer platform 13 and the translation portions and the wafer support portions mounted thereto elevate carrying the first wafer to the storage location 49 (between the wafer platform 13 and the wafer position sensors 17a, 17b). The storage pins 43a, 43b shift horizontally to center the first wafer based on information provided by the wafer position sensors 17a, 17b.

While the first wafer is being elevated and centered the wafer handler 35 (FIG. 2) extracts a second wafer from the multi-slot wafer carrier 37, transports the second wafer between the translation portions 45a, 45b, and places the second wafer on the wafer platform 13. After centering of the first wafer is complete, the wafer handler 35 extracts the centered first wafer from the storage location 49 and returns it to the multi-slot wafer carrier 37 while the wafer support portions 47a, 47b assume the wafer passage position and while the translation portions 45a, 45b assume the platform level position.

Once in position beneath the second wafer, the wafer support portions 47a, 47b again assume the wafer supporting position (via rotation or extension) and the translation portions 45a, 45b elevate, lifting the second wafer to the storage location 49 where centering occurs. In this manner, placement of the second wafer and extraction of the first wafer occur consecutively and centering of the first and second wafers occur consecutively.

Figure 6:
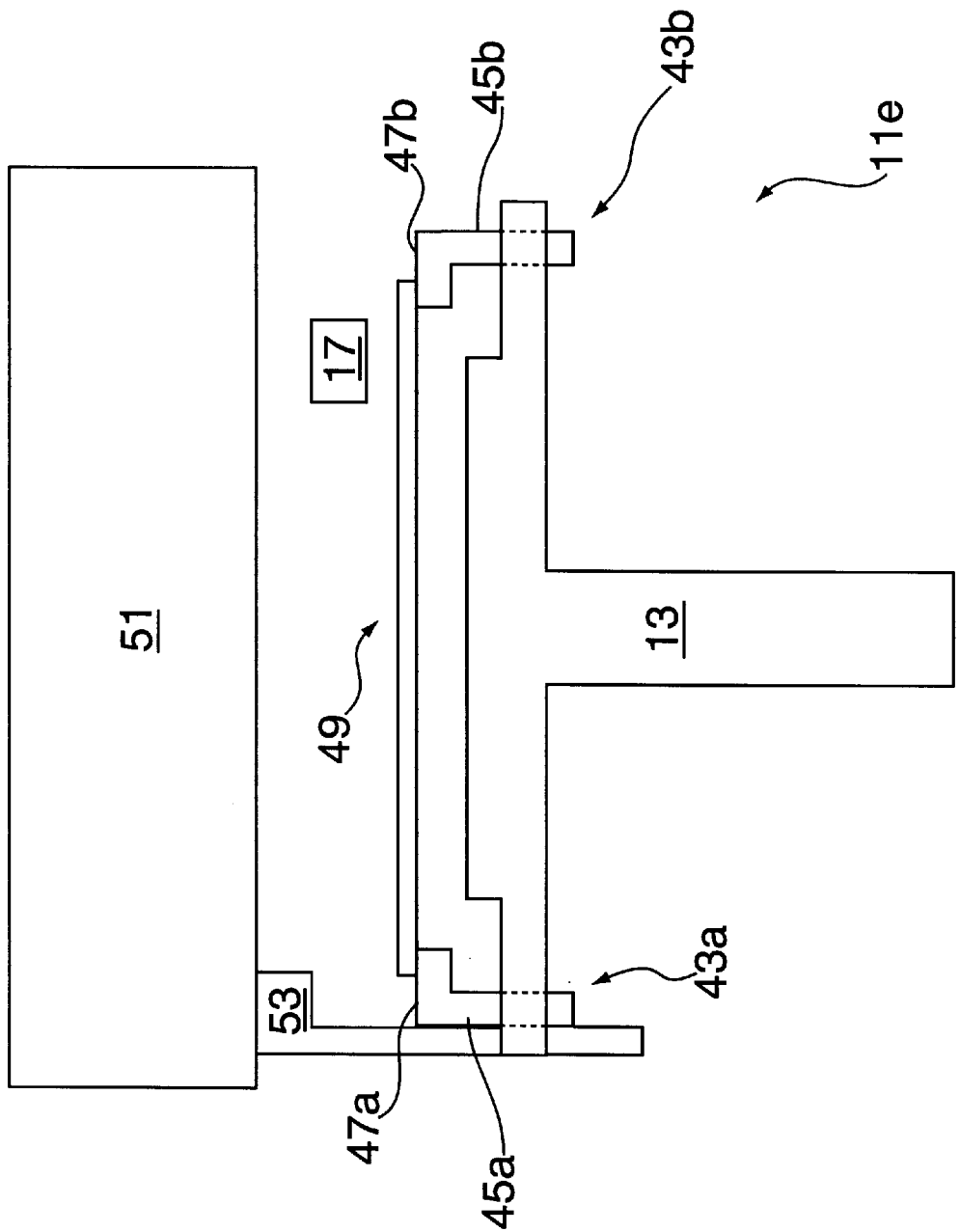
FIG. 6 is a side elevational view of a fifth aspect of the inventive wafer positioning device having an additional storage location above the position sensor and a wafer handler for transferring wafers thereto.

FIG. 6 is a side elevational view of an inventive wafer positioner 11e configured in accordance with a fifth aspect of the invention. The inventive wafer positioner 11e comprises an auxiliary storage location 51, which may comprise one or more storage locations (e.g., conventional storage mechanisms; the inventive storage locations 23 and/or 40a–b, as in FIG. 1C and FIG. 3; the inventive storage locations 49 as in FIGS. 4A–B and 5; etc.) above the wafer position sensor 17, and a transfer mechanism 53 operatively coupled to the wafer platform 13 and dedicated to transferring wafers between the auxiliary storage location 51 and either the wafer platform 13, or the storage location 49. The fifth aspect of the invention may be used in conjunction with any of aspects 1–4 of the invention in order to further enhance the versatility of the wafer transport and positioning process.

In operation a wafer is positioned in accordance with any aspect 1–4 of the invention and is then transferred either directly from the wafer platform 13 to the auxiliary storage location 51 via the transfer mechanism 53, or from the wafer platform 13 to the storage location 49 and then, via the transfer mechanism 53, to the auxiliary storage location 51. Thus, in the configuration of FIG. 6, the invention provides additional storage options that may be used in any sequence to further adjust for bottlenecks that may occur in a given transport and positioning operation.

FIG. 7 is a timing diagram useful in comparing the wafer transport and processing operation of the inventive wafer positioning device and the wafer transport and processing operation of a conventional wafer positioning device. FIG. 7 is representative of the operation of the inventive wafer positioning device when configured with only a first storage location, and without the additional or auxiliary storage locations 40a–b, 51.

The conventional wafer transport and positioning operation is represented in the upper portion of FIG. 7. The wafer transport and positioning operation of the inventive positioning device, and of the wafer handler used therewith is represented in the lower portion of FIG. 7. To facilitate explanation the operating steps are abbreviated within FIG. 7 as follows:

Get N=extract wafer number N from the wafer carrier and transport wafer number N to the positioning device;

Put N=extract wafer number N from the positioning device and transport wafer number N to the wafer carrier;

Position N=position wafer number N.

At Time $t_1$ within the conventional system the wafer handler gets a first wafer from the wafer carrier and places it on the positioning device;

within the inventive system the wafer handler gets a first wafer from the wafer carrier and places it on the positioning device.

At Time $t_2$ within the conventional system the positioning device positions the first wafer while the wafer handler idles;

within the inventive system the positioning device positions the first wafer while the wafer handler travels to the wafer carrier.

At Time $t_3$ within the conventional system the wafer handler continues to idle while the positioning device positions the first wafer;

within the inventive system the wafer handler gets a second wafer from the wafer carrier and transports it to the positioning device while the positioning device continues to position the first wafer. After the first wafer is positioned, the first wafer is transferred from the wafer platform to the storage location of the inventive positioning device. During the transfer of the first wafer from the wafer platform to the storage location, the wafer handler places the second wafer on the wafer platform of the inventive positioning device. Note that the time to lift each wafer to the storage location is negligible compared to the positioning time, and is therefore not shown in FIG. 7.

At Time $t_4$ within the conventional system the wafer handler transfers the first wafer from the positioning device to the wafer carrier while the positioning device idles;

within the inventive system the wafer handler transfers the first wafer from the storage location of the inventive positioning device to the wafer carrier while the positioning device positions the second wafer.

At Time $t_5$ within the conventional system the wafer handler gets a second wafer from the wafer carrier, while the positioning device idles;

within the inventive system the positioning device continues to position the second wafer.

At Time $t_6$ within the conventional system the wafer handler idles while the positioning device positions the second wafer;

within the inventive system the wafer handler gets a third wafer from the wafer carrier and transports the third wafer to the positioning device while the positioning device continues to position the second wafer. After the second wafer is positioned, the second wafer is transferred from the wafer platform to the storage location of the positioning device.

At Time $t_7$ within the conventional system the wafer handler idles while the positioning device continues to position the second wafer;

within the inventive system the wafer handler transfers the second wafer from the storage location of the inventive positioning device to the wafer carrier while the positioning device positions the third wafer and the wafer handler places the third wafer on the wafer platform of the inventive positioning device.

At Time $t_8$ within the conventional system the wafer handler continues to idle while the positioning device positions the second wafer;

within the inventive system the wafer handler continues to position the third wafer.

At Time $t_9$ within the conventional system the wafer handler transfers the second wafer from the positioning device to the wafer carrier;

within the inventive system the wafer handler gets a fourth wafer from the wafer carrier and transports the fourth wafer to the positioning device while the positioning device continues to position the third wafer. After the third wafer is positioned, the third wafer is transferred from the wafer platform to the storage location of the inventive positioning device and the wafer handler places the fourth wafer on the wafer platform of the inventive positioning device.

Thereafter, as shown in FIG. 7, the sequence continues in the same manner. As FIG. 7 clearly depicts, the inventive wafer positioning device experiences significantly less idle time than the conventional wafer positioning device, thereby increasing throughput. In fact, the inventive wafer positioning device receives the fourth wafer while the conventional wafer positioning device is still removing the second wafer from the conventional positioning device (as shown at time $t_9$). Thus, the inventive wafer positioning device achieves nearly twice the throughput of conventional wafer positioning devices and provides a significant advantage over conventional wafer positioning devices.

The foregoing description discloses only the preferred embodiments of the invention, modifications of the above disclosed apparatus and method which fall within the scope of the invention will be readily apparent to those of ordinary skill in the art. For instance, although the storage mechanism shown in FIGS. 4 and 5 preferably extends upwardly from the wafer platform, it is not limited thereto. For example, the storage mechanism can be mounted above the wafer platform and can extend downwardly to extract the wafer from the wafer platform. Similarly, the "storage towers" may be replaced with wafer supporting portions that extend from the side walls of a surrounding chamber.

As well, the number of wafer lift pins, storage pins and/or storage towers may vary. For instance, a single lift pin, a single storage pin (as shown in FIGS. 8A–B) and/or a single storage tower with sufficient surface area to stably support a wafer may be employed. However, in order to provide optimal wafer stability without excessive component costs, three wafer lift pins and three storage towers are preferred in the first and second aspects of the invention, and two storage pins are preferred in the third and fourth aspects of the invention. Additionally, the wafer positioning device of the present invention can be employed either for a rough preposition or for more sensitive positioning operations.

Accordingly, while the present invention has been disclosed in connection with the preferred embodiments thereof, it should be understood that other embodiments may fall within the spirit and scope of the invention, as defined by the following claims.

The invention claimed is:

1. A wafer positioning device comprising a wafer platform;

a set of wafer lift pins operatively coupled to the wafer platform and adapted to lift and shift so as to selectively position a wafer and store a wafer, the set of wafer lift pins further adapted to allow a first wafer to be transferred to or from the wafer platform by transporting the first wafer between the lift pins when a second wafer is stored above the first wafer by the set of wafer lift pins; and a wafer position sensor operatively coupled to the wafer platform.

2. The apparatus of claim 1 wherein the set of wafer lift pins comprises a wafer support portion capable of selectively assuming a wafer supporting position and a wafer passage position.

3. A wafer positioning device comprising;
a wafer platform;
a storage mechanism comprising a pair of storage pins operatively coupled to the wafer platform so as to lift a wafer therefrom, each storage pin having a translation portion adapted to translate a wafer between a wafer platform elevation in which each storage pin is lowered and a storage elevation in which each storage pin is raised, and a wafer support portion coupled to the translation portion and extending inwardly therefrom so as to allow a wafer to be placed on or extracted from a position on the wafer platform that is below the wafer support position by transporting the wafer between the storage pins; and
a wafer position sensor adapted to sense the position of a wafer on the wafer platform.

4. The apparatus of claim 3 wherein each storage pin is shiftable so as to provide wafer centering capability.

5. The apparatus of claim 3 wherein a sufficient space exists between each storage pin and the wafer position sensor when the storage pin is in the storage elevation to allow a wafer to be transferred to and from each storage pin, and a sufficient space exists between the storage elevation and the wafer platform when the storage pin is in the storage elevation to allow a wafer to be transferred to and from the wafer platform.

6. A wafer positioning device comprising:
a wafer platform;
a storage mechanism comprising a pair of storage pins operatively coupled to the wafer platform so as to lift a wafer therefrom, each storage pin having a translation portion adapted to translate a wafer between a wafer platform elevation in which each storage pin is lowered and a storage elevation in which each storage pin is raised, and a wafer support portion coupled to the translation portion and extending inwardly therefrom; and
a wafer position sensor adapted to sense the position of a wafer on the wafer platform;
wherein the storage mechanism comprises a pair of storage pins operatively coupled to the wafer platform, each storage pin having a translation portion adapted to translate a wafer between the wafer platform elevation and the storage elevation, wherein a sufficient space exists between the translation portions of the storage pins so as to allow an off-center wafer to travel therethrough.

7. The apparatus of claim 6 wherein the translation portion of each storage pin is rotatable so as to selectively rotate the wafer support portion between a wafer supporting position and a wafer passage position.

8. The apparatus of claim 6 wherein the wafer support portion of each storage pin is retractable so as to selectively extend and retract between a wafer supporting position and a wafer passage position.

9. A wafer positioning device comprising:
a wafer platform;
a storage mechanism comprising a pair of storage pins operatively coupled to the wafer platform so as to lift a wafer therefrom, each storage pin having a translation portion adapted to translate a wafer between a wafer platform elevation in which each storage pin is lowered and a storage elevation in which each storage pin is raised, and a wafer support portion coupled to the translation portion and extending inwardly therefrom;
a wafer position sensor adapted to sense the position of a wafer on the wafer platform;
a wafer presence sensor operatively coupled to each storage pin for determining whether a wafer is present in a region between the wafer platform and the wafer position sensor; and
a controller for altering the operation of the wafer positioning mechanism when the wafer presence sensor detects a wafer present in the region between the wafer positioning mechanism and the wafer position sensor.

10. A wafer transfer and positioning process comprising:
positioning a first wafer on a wafer platform of a wafer positioning device; and
translating the first wafer between the wafer platform and a storage location via a pair of pins that raise from the wafer platform to form the storage location, each pin being configured to allow wafer transfer to or from a position on the wafer platform that is below the storage location while each pin is raised and by transporting the wafer between the pins.

11. A wafer transfer and positioning process comprising:
positioning a first wafer on a wafer platform of a wafer positioning device;
translating the first wafer between the wafer platform and a storage locate,ion via a pair of pins that raise from the wafer platform to form the storage location, each pin being configured to allow wafer transfer to or from the wafer platform while each pin is raised;
placing a second wafer on the wafer platform; and
extracting the first wafer from the storage location.

12. The process of claim 11 wherein placing the second wafer and extracting the first wafer occur consecutively via a first wafer handler.

13. The process of claim 12 further comprising positioning the second wafer wherein the positioning of the first wafer and the positioning of the second wafer occur consecutively.

14. The process of claim 13 further comprising sensing the storage location to determine whether the first wafer is present in the storage location and, if so, delaying the positioning of the second wafer.

15. A wafer transfer and positioning process comprising:
positioning a first wafer on a storage location formed via a pair of pins that extend from a wafer platform;
translating the first wafer from the storage location to the wafer platform by lowering each pin;
positioning the first wafer on the wafer platform with each pin;
raising each pin so as to form the storage location;
placing a second wafer on the storage location; and
extracting the first wafer from the wafer platform.

16. The process of claim 15 wherein placing the second wafer and extracting the first wafer occur consecutively.

17. A wafer positioning device comprising:
a wafer platform;
a set of wafer lift pins operatively coupled to the wafer platform and adapted to selectively position a wafer and store a wafer, the set of wafer lift pins further adapted to allow a first wafer to be transferred to or from the wafer platform when a second wafer is stored by the set of wafer lift pins; and
a wafer position sensor operatively coupled to the wafer platform;
wherein the set of wafer lift pins comprises at least two lift pins, each having a translation portion spaced apart by a distance greater than the diameter of a wafer to be positioned thereby and adapted to lift and lower relative to the wafer platform, and each having a support portion coupled to the translation portion and extending inwardly therefrom so that a wafer may be supported thereby.

18. The apparatus of claim 17 wherein the wafer support portions are adapted to selectively assume a wafer supporting position and a wafer passage position.

19. A wafer positioning device comprising:

a wafer platform;

a storage mechanism comprising at least two storage pins operatively coupled to the wafer platform so as to lift a wafer therefrom, each storage pin having a translation portion adapted to translate a wafer between a wafer platform elevation in which each storage pin is lowered and a storage elevation in which each storage pin is raised, and a wafer support portion coupled to the translation portion and extending inwardly therefrom so as to allow a wafer to be placed on or extracted from a position on the wafer platform that is directly below the wafer support position; and a wafer position sensor adapted to sense the position of a wafer on the wafer platform;

wherein the translation portions of each storage pin are spaced apart by a distance greater than the diameter of a wafer to be positioned thereby.

* * * * *